US011515150B2

(12) United States Patent
Tsiang et al.

(10) Patent No.: US 11,515,150 B2
(45) Date of Patent: Nov. 29, 2022

(54) HARDMASK TUNING BY ELECTRODE ADJUSTMENT

(71) Applicant: Applied Materials, Inc., Santa Clara, CA (US)

(72) Inventors: Michael Wenyoung Tsiang, Milpitas, CA (US); Abdul Aziz Khaja, San Jose, CA (US); Li-Qun Xia, Cupertino, CA (US); Kevin Hsiao, ChuBei (TW); Liangfa Hu, Newark, CA (US); Yayun Cheng, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/077,926

(22) Filed: Oct. 22, 2020

(65) Prior Publication Data

US 2022/0130665 A1    Apr. 28, 2022

(51) Int. Cl.
*H01L 21/02* (2006.01)
*C23C 16/26* (2006.01)
*H01L 21/311* (2006.01)

(52) U.S. Cl.
CPC ........ *H01L 21/02274* (2013.01); *C23C 16/26* (2013.01); *H01L 21/31144* (2013.01); *H01L 21/02115* (2013.01); *H01L 21/02118* (2013.01)

(58) Field of Classification Search
CPC ......... H01L 21/02274; H01L 21/31144; H01L 21/02115; H01L 21/02118; C23C 16/26
See application file for complete search history.

(56) References Cited

U.S. PATENT DOCUMENTS

| 6,339,297 | B1 | 1/2002 | Sugai et al. |
| 7,196,283 | B2 | 3/2007 | Buchberger, Jr. et al. |
| 9,865,431 | B2 * | 1/2018 | Ayoub ............... H01J 37/32174 |
| 10,879,041 | B2 * | 12/2020 | Ye ...................... H01J 37/32082 |
| 2005/0287771 | A1 | 12/2005 | Seamons et al. |
| 2010/0093187 | A1 | 4/2010 | Lee et al. |
| 2010/0240215 | A1 * | 9/2010 | Huang .................. B81C 1/0015 |
| | | | 427/535 |
| 2011/0049101 | A1 * | 3/2011 | Juco ................... H01J 37/32541 |
| | | | 156/345.28 |
| 2012/0276743 | A1 * | 11/2012 | Won .................. H01L 21/76802 |
| | | | 257/E21.27 |
| 2013/0105303 | A1 * | 5/2013 | Lubomirsky ..... H01J 37/32357 |
| | | | 204/192.34 |

(Continued)

OTHER PUBLICATIONS

Grill, "Diamond-like carbon: state of the art," Diamond and Related Materials, vol. 8, Issues 2-5, Mar. 1999, pp. 428-434 (Year: 1999).*

(Continued)

*Primary Examiner* — Binh X Tran
*Assistant Examiner* — Christopher Remavege
(74) *Attorney, Agent, or Firm* — Kilpatrick Townsend & Stockton LLP

(57) ABSTRACT

Exemplary processing methods may include forming a plasma of a deposition precursor in a processing region of a semiconductor processing chamber. The methods may include adjusting a variable capacitor within 20% of a resonance peak. The variable capacitor may be coupled with an electrode incorporated within a substrate support on which a substrate is seated. The methods may include depositing a material on the substrate.

20 Claims, 5 Drawing Sheets

(56) References Cited

U.S. PATENT DOCUMENTS

| | | | |
|---|---|---|---|
| 2014/0290576 A1* | 10/2014 | Chen | H01J 37/32091 |
| | | | 118/723 R |
| 2014/0302256 A1* | 10/2014 | Chen | C23C 16/46 |
| | | | 118/500 |
| 2014/0367043 A1* | 12/2014 | Bishara | H01J 37/32082 |
| | | | 156/345.28 |
| 2015/0162168 A1 | 6/2015 | Oehrlein et al. | |
| 2016/0013022 A1* | 1/2016 | Ayoub | H01J 37/32183 |
| | | | 118/723 R |
| 2018/0130637 A1* | 5/2018 | Ayoub | H01J 37/32935 |
| 2020/0051784 A1* | 2/2020 | Galstyan | H01J 37/32082 |
| 2020/0091418 A1* | 3/2020 | Annunziata | H01L 43/12 |

OTHER PUBLICATIONS

Iwaki ("Estimation of the atomic density of amorphous carbon using ion implantation, SIMS and RBS", Surface and Coating Technology 158-159, 2002). (Year: 2002).*

International Search Report and Written Opinion dated Feb. 7, 2022 in International Patent Application No. PCT/US2021/055464, 7 pages.

* cited by examiner

HARDMASK TUNING BY ELECTRODE ADJUSTMENT

TECHNICAL FIELD

The present technology relates to components and apparatuses for semiconductor manufacturing. More specifically, the present technology relates to processes for producing material films for semiconductor processing.

BACKGROUND

Integrated circuits are made possible by processes which produce intricately patterned material layers on substrate surfaces. Producing patterned material on a substrate requires controlled methods for forming and removing material. Some processes utilize plasma-enhanced precursors to facilitate deposition or removal operations. The substrate support may be utilized in some technologies to develop a substrate-level plasma, as well as to chuck the substrate to the support electrostatically. Characteristics of the plasma may impact aspects of materials being produced, and may cause parasitic plasma formation in unfavorable regions of the chamber.

Thus, there is a need for improved systems and methods that can be used to produce high quality devices and structures. These and other needs are addressed by the present technology.

SUMMARY

Exemplary processing methods may include forming a plasma of a deposition precursor in a processing region of a semiconductor processing chamber. The methods may include adjusting a variable capacitor within 20% of a resonance peak. The variable capacitor may be coupled with an electrode incorporated within a substrate support on which a substrate is seated. The methods may include depositing a material on the substrate.

In some embodiments, the deposition precursor may be or include a carbon-containing precursor. The material deposited may be characterized by greater than or about 67 at. % carbon within the material. The material deposited may be characterized by a density of greater than or about $1.15 \times 10^{23}$ at./cm$^3$. The variable capacitor may be maintained below the resonance peak at processing conditions for the depositing. The variable capacitor may be adjusted to receive greater than or about 25 amps of current during the depositing. The variable capacitor may be adjusted to greater than or about 35% capacitance. The electrode incorporated within the substrate support may also be coupled with a DC power supply to operate as an electrostatic chuck. The methods may include etching the material relative to an exposed silicon oxide. The silicon oxide may be etched at a selectivity greater than or about 2:1 relative to the material. The semiconductor processing chamber may include a plasma generator coupled with a faceplate at least partially defining the processing region of the semiconductor processing chamber.

Some embodiments of the present technology may encompass semiconductor processing methods. The methods may include forming a plasma of a carbon-containing precursor in a processing region of a semiconductor processing chamber. The methods may include increasing capacitance of a variable capacitor within 10% of a resonance peak. The variable capacitor may be coupled with an electrode incorporated within a substrate support on which a substrate is seated. The methods may include depositing a carbon-containing material on the substrate.

In some embodiments, the methods may include etching the carbon-containing material relative to an exposed silicon oxide. The silicon oxide may be etched at a selectivity greater than or about 10:1 relative to the carbon-containing material. The material deposited may be characterized by greater than or about 70 at. % carbon within the carbon-containing material. The carbon-containing material deposited may be characterized by a density of greater than or about $1.18 \times 10^{23}$ at./cm$^3$. The semiconductor processing chamber includes a plasma generator coupled with a faceplate at least partially defining the processing region of the semiconductor processing chamber. The capacitance may be increased to greater than or about 40%.

Some embodiments of the present technology may encompass semiconductor processing methods. The methods may include forming a plasma of a carbon-containing precursor in a processing region of a semiconductor processing chamber. The methods may include increasing capacitance of a variable capacitor within 20% of a resonance peak. The variable capacitor may be coupled with an electrode incorporated within a substrate support on which a substrate is seated. The methods may include depositing a carbon-containing material on the substrate. The methods may include etching the carbon-containing material relative to an exposed silicon oxide. The silicon oxide may be etched at a selectivity greater than or about 2:1 relative to the carbon-containing material. In some embodiments, the carbon-containing material deposited may be characterized by greater than or about 70 at. % carbon within the carbon-containing material. The carbon-containing material may be characterized by a density of greater than or about $1.15 \times 10^{23}$ at./cm$^3$.

Such technology may provide numerous benefits over conventional systems and techniques. For example, embodiments of the present technology may produce carbon-containing films characterized by an increased carbon content within the film, while maintaining film density. Additionally, produced films may have increased selectivity over silicon oxide or other materials for improved operations as hard masks. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
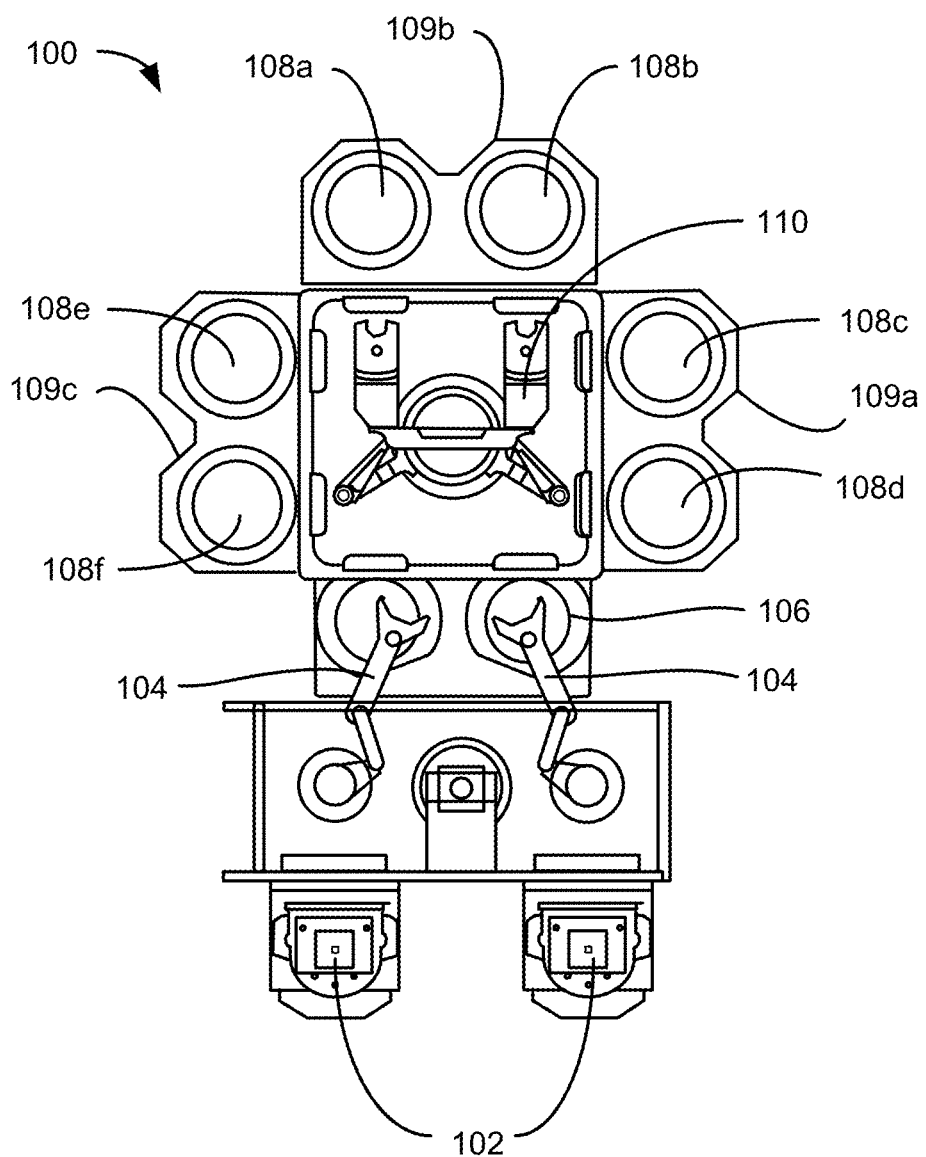
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, processing operations may seek to reduce film thicknesses, while increasing selectivity of masks relative to materials being etched. Conventional methods may be forced to deposit thicker hardmask films to accommodate selectivity requirements. Additionally, conventional methods of adjusting film characteristics for hardmask films may include tradeoffs that may detrimentally impact the film or subsequent processing. For example, some conventional processing to increase material selectivity of hardmasks may also increase stress or form more porous films that can cause damage or other issues during later processing operations.

The present technology overcomes these challenges by producing hardmask films having tuned material concentrations that may allow an increase in selectivity for etching operations, while maintaining or improving film characteristics. By increasing plasma coupling with the substrate according to some embodiments of the present technology, hardmask film atomic incorporation levels may be adjusted, which may provide an additional control for adjusting film properties to affect subsequent etching.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include tuners according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of hardmasks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
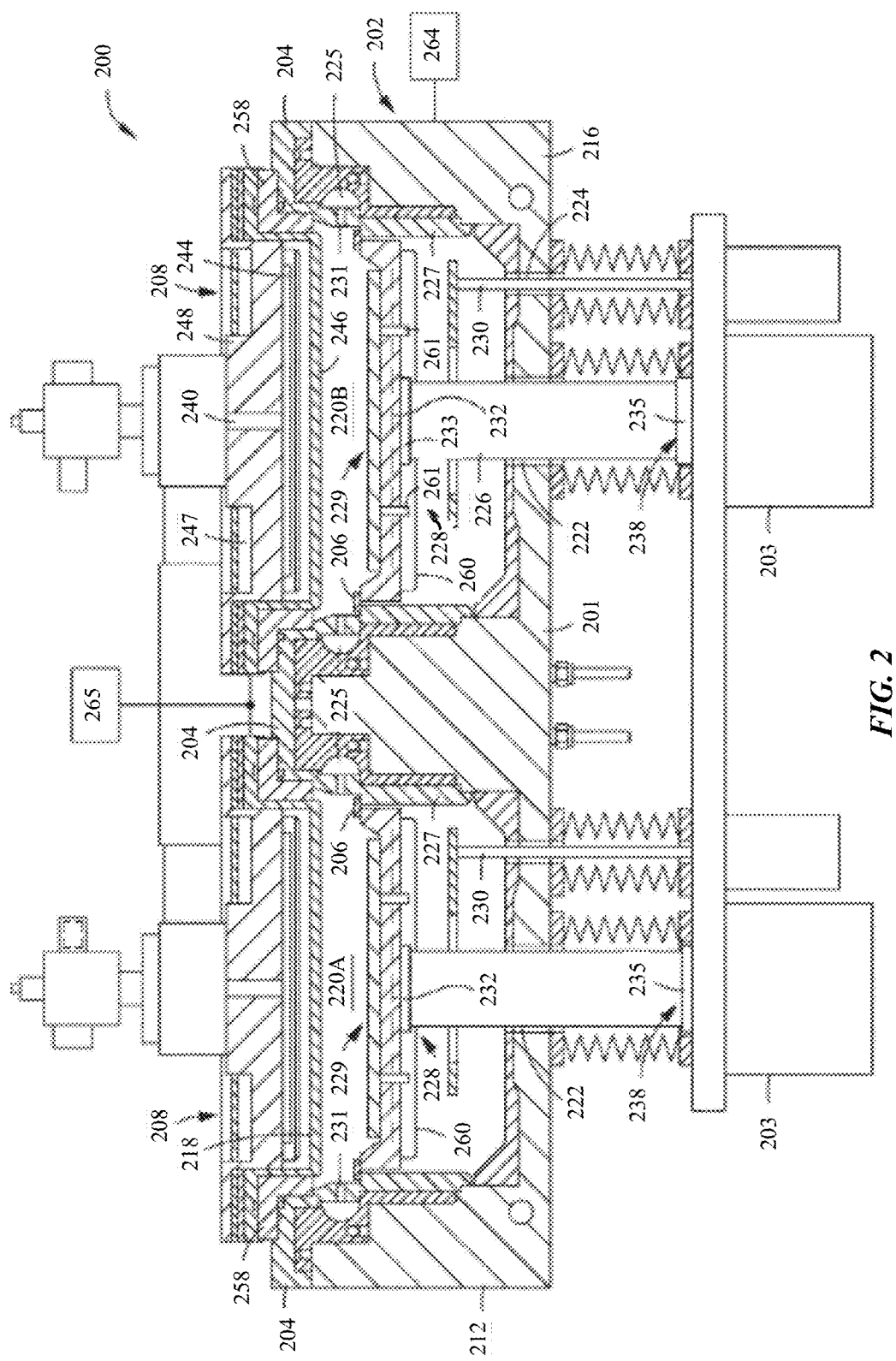
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
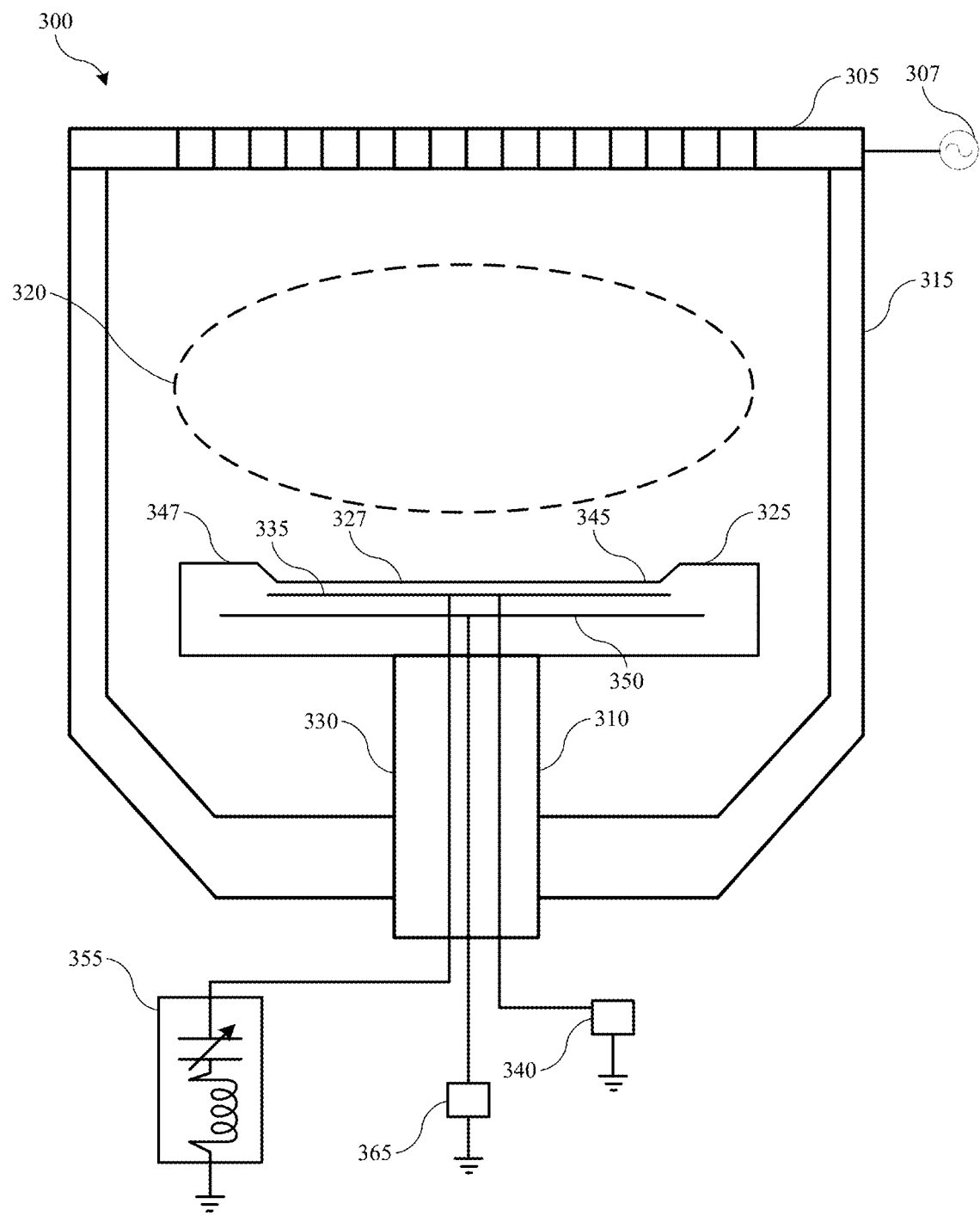
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of hardmasks as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body, although it is to be understood that other substrate supports with alternative chucking capabilities may also be encompassed by the present technology. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335, which may be embedded within the chuck body proximate the substrate support surface. Electrode 335 may be electrically coupled with a DC power source 340. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electric bias to the substrate to provide electrostatic clamping of the substrate to the substrate support surface. Power source 340 may include a filter, a power supply, and a number of other electrical components configured to provide a chucking voltage.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

In some embodiments a tuner 355 may be included within the system, which may be electrically coupled with electrode 335. Tuner 355 may include any number of components including a variable capacitor, an inductor, and other components, which may facilitate a top RF power feed in embodiments, such as based on RF source 307. The variable capacitor in tuner 355 may be used to control flow through the electrode 335. For example, instead of increasing power from a power supply to add power to the plasma, in some embodiments the control scheme may utilize the variable capacitor and tuner to increase or lower the capacitance, which may impact an amount of coupling between the plasma and the substrate seated on the substrate support. By increasing the capacitance of the variable capacitor, coupling may be increased between the plasma and the substrate up to a resonance peak, at which point coupling may transition from capacitive coupling to inductive coupling. Continuing to increase the capacitance of the variable capacitor beyond the peak may further increase the inductive coupling, which may impact plasma processing.

For example, processing in a capacitive regime may increase coupling with the substrate, while processing in an inductive regime may increase coupling with the chamber walls or other chamber components. The current transfer through the substrate may increase with an increasing capacitance up to a resonance peak, at which point coupling with the chamber walls or other grounded components may increase. This may reduce current transfer to the substrate, which can impact film formation and properties or characteristics of the film formed. While many conventional formation processes may operate at a set location along the curve based on chamber and processing conditions, the present technology may adjust the capacitance to perform closer to the resonance peak, which may produce improved hardmasks and other films according to embodiments of the present technology.

Figure 4:
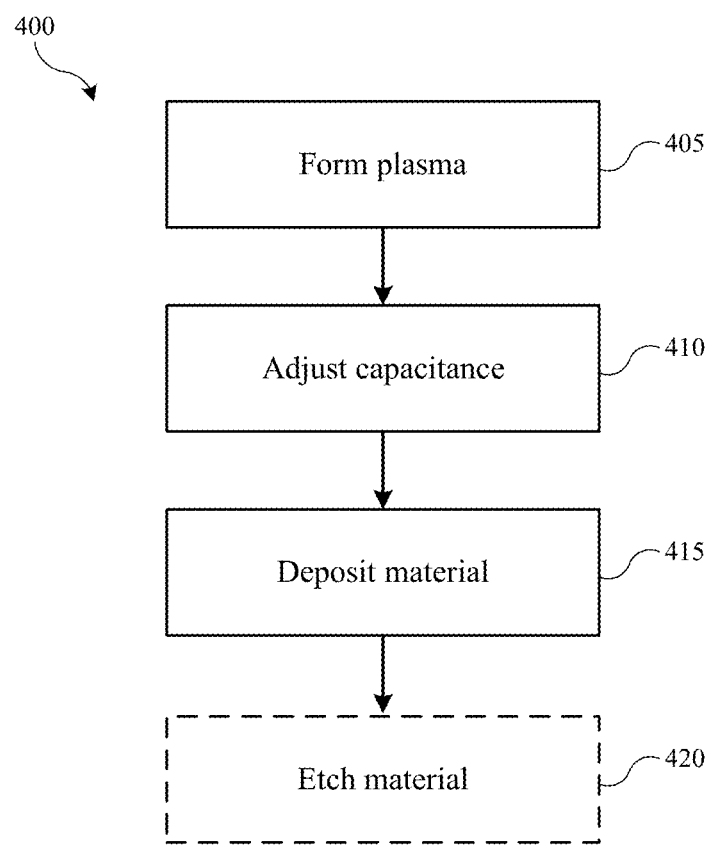
FIG. 4 shows exemplary operations in a semiconductor processing method according to some embodiments of the present technology.

Although the remaining disclosure will discuss a particular hardmask process, it is to be understood that the present technology may be applied to any number of processing operations including formation and removal processes occurring during fabrication. FIG. 4 shows exemplary operations in a semiconductor processing method 400 according to some embodiments of the present technology. The method may be performed in a variety of processing chambers, including processing system 200 or 300 described above. Method 400 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated.

Method 400 may include additional operations prior to initiation of the listed operations. For example, additional processing operations may include forming structures on a semiconductor substrate, which may include both forming and removing material. Prior processing operations may be performed in the chamber in which method 400 may be performed, or processing may be performed in one or more other processing chambers prior to delivering the substrate into the semiconductor processing chamber in which method 400 may be performed. Regardless, method 400 may optionally include delivering a semiconductor substrate to a processing region of a semiconductor processing chamber, such as processing system 200 described above, or other chambers that may include components as described above. The substrate may be deposited on a substrate support, which may be a pedestal such as pedestal 228 or 310, and which may reside in a processing region of the chamber, such as processing region 320 described above.

The substrate may be any number of materials on which materials may be deposited. The substrate may be or include silicon, germanium, dielectric materials including silicon oxide or silicon nitride, metal materials, or any number of combinations of these materials, which may be the substrate, or materials formed on the substrate. In some embodiments optional treatment operations, such as a pretreatment, may be performed to prepare a surface of the substrate for deposition. For example, a pretreatment may be performed to provide certain ligand terminations on the surface of the substrate, and which may facilitate nucleation of a film to be deposited. For example, hydrogen, oxygen, carbon, nitrogen, or other molecular terminations, including any combination of these atoms or radicals, such as amidogen or other functional groups, as non-limiting examples, may be adsorbed, reacted, or formed on a surface of the substrate. Additionally, material removal may be performed, such as reduction of native oxides or etching of material, or any other operation that may prepare one or more exposed surfaces of the substrate for deposition.

One or more precursors may be delivered to the processing region of the chamber. For example, the film being deposited may be a mask film used in semiconductor processing. The deposition precursors may include any number of mask precursors, including a carbon-containing precursor, although it is to be understood that any other precursor may similarly be encompassed as well as dopant precursors for modifying the mask being produced. The precursors may be flowed together or separately. For example, in exemplary embodiments in which a carbon-containing material may be formed, a carbon-containing precursor and any dopant precursors may be delivered to the processing region of the processing chamber. Plasma enhanced deposition may be performed in some embodiments of the present technology, which may facilitate material reactions and deposition.

The precursors delivered may all be used to form a plasma within the processing region of the semiconductor processing chamber at operation 405, which may begin a deposition process to form a carbon-containing material, or any other material, on a substrate within the processing region of the processing chamber. As noted above, based on temperature, pressure, plasma power, or other conditions or characteristics, an amount of coupling may occur between the plasma and the substrate, which may impact properties of the film being produced. The present technology may include adjusting a capacitance of a variable capacitor incorporated in a tuner, such as a bottom tuner incorporated in a top RF power feed arrangement as discussed above. For example, at operation 410, the capacitor may be adjusted, including increasing or decreasing the capacitor, to a capacitance within 20% of a resonance peak for the plasma coupling with the substrate. Method 400 may include depositing a material, such as a carbon-containing material, at operation 415, which may be modified by the increased coupling between the plasma and the substrate. As will be discussed further below, in one exemplary process, carbon concentration within the deposited material may be increased, while a film density and other material properties may be substantially maintained.

The carbon-containing precursor may be or include any number of carbon-containing precursors. For example, the carbon-containing precursor may be or include any hydrocarbon, or any material including or consisting of carbon and hydrogen. In some embodiments, the carbon-containing precursor may be characterized by one or more carbon-carbon double bonds and/or one or more carbon-carbon triple bonds. Accordingly, in some embodiments the carbon-containing precursor may be or include an alkene or an alkyne, or any other carbon-containing material. The precursor may include carbon-and-hydrogen-containing precursors, which may include any amount of carbon and hydrogen bonding, along with any other element bonding, although in some embodiments the carbon-containing precursor may consist of carbon-to-carbon and carbon-to-hydrogen bonding.

By increasing plasma coupling with the substrate as explained above, a carbon concentration within the film may be increased. For example, films formed according to some embodiments of the present technology may be characterized by a carbon concentration of greater than or about 65 at. % in the deposited film, and in some embodiments as-deposited films may be characterized by greater than or about 66 at. %, greater than or about 67 at. %, greater than or about 68 at. %, greater than or about 69 at. %, greater than or about 70 at. %, greater than or about 71 at. %, greater than or about 72 at. %, greater than or about 73 at. %, greater than or about 74 at. %, greater than or about 75 at. %, or more. In some embodiments hydrogen may represent the bulk of the residual material in the film, and a hydrogen-concentration may be minimized, and may be reduced based on the increased coupling produced without increasing porosity within the film.

By tuning the plasma coupling according to embodiments of the present technology, carbon concentration may be improved, while maintaining or limiting a reduction in density of the as-deposited film. This may improve etch selectivity relative to other materials. For example, in some embodiments a silicon oxide material may be etched using the carbon-containing hardmask formed by embodiments of the present technology in an optional etching operation 420. By increasing the carbon-concentration while maintaining or improving film density, the hardmask may provide increased selectivity over oxide compared to conventional masks. This may allow masks to be formed having reduced thickness, or may improve an amount of material removal with masks formed. For example, by utilizing masks according to embodiments of the present technology, selectivity may be doubled over standard carbon masks, and selectivity of a silicon oxide etch relative to removal of the carbon-containing material may be greater than or about 2:1, and may be greater than or about 10:1, greater than or about 20:1, greater than or about 50:1, greater than or about 100:1, or more.

Films produced according to embodiments of the present technology, which may have increased carbon concentration may be characterized by a density of the as-deposited film of greater than or about $1.10 \times 10^{23}$ at./cm$^3$, and may be characterized by an as-deposited density of greater than or about $1.12 \times 10^{23}$ at./cm$^3$, greater than or about $1.13 \times 10^{23}$ at./cm$^3$, greater than or about $1.14 \times 10^{23}$ at./cm$^3$, greater than or about $1.15 \times 10^{23}$ at./cm$^3$, greater than or about $1.16 \times 10^{23}$ at./cm$^3$, greater than or about $1.17 \times 10^{23}$ at./cm$^3$, greater than or about $1.18 \times 10^{23}$ at./cm$^3$, greater than or about $1.19 \times 10^{23}$ at./cm$^3$, greater than or about 1.20×10$^{23}$ at./cm$^3$, greater than or about 1.21×10$^{23}$ at./cm$^3$, greater than or about 1.22×10$^{23}$ at./cm$^3$, or greater.

Figure 5A:
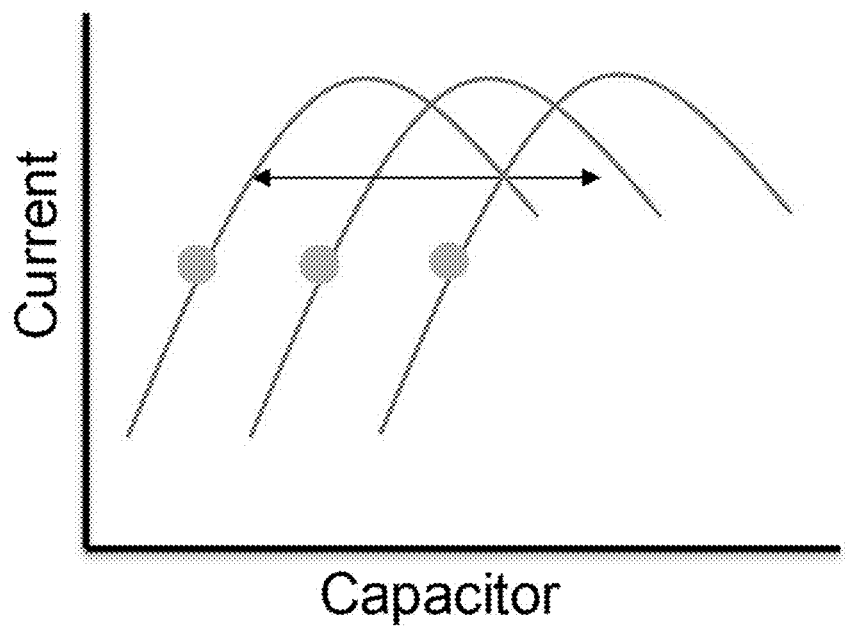
FIGS. 5A-5B show schematic charts illustrating effects of operational changes on plasma processing according to some embodiments of the present technology.
Figure 5B:
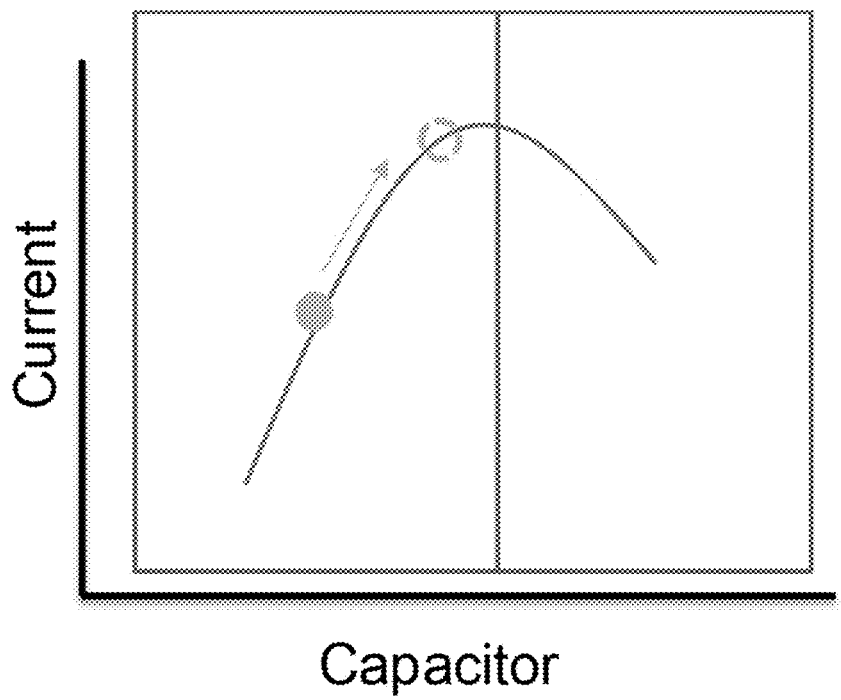

This increased or maintained density may be improved based on the increased coupling between the plasma and the substrate utilizing the variable capacitor in the bottom tuner to perform deposition nearer to the resonance peak for the process. The resonance peak may be affected by any number of processing conditions within the chamber. FIGS. 5A-5B show schematic charts illustrating effects of operational changes on plasma processing according to some embodiments of the present technology. For example, as illustrated in FIG. 5A, many conventional techniques may attempt to adjust film properties by adjusting one or more processing conditions. By adjusting conditions including processing pressure, spacing between the substrate and the electrode, plasma power, or precursor ratios, the process may shift the plasma coupling curve to the left or right, but may not affect the operational setpoint of the process being performed.

The present technology may adjust the capacitance during processing to perform the operations near the resonance peak as illustrated in FIG. 5B. As noted above, coupling between the plasma and the substrate may be increased as the variable capacitor is tuned and the capacitor position is increased between 0% and 100%. As the capacitor is tuned to a higher percentage of the capacitor range, coupling may be increased as the process moves toward the resonance peak illustrated. This may increase an amount of current transferred to the substrate as plasma coupling increases. Thus, in some embodiments the capacitor may be tuned to greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, or higher. As the capacitor is further tuned, the process may move into an inductive regime where more coupling may occur between the plasma and the chamber body, which may reduce the amount of current received through the substrate as illustrated on the curve. This may also cause parasitic plasma formation within the chamber, and/or arcing with chamber components along with a reduction in the carbon-concentration within the film.

Accordingly, in some embodiments the capacitor may be maintained at a capacitor position of less than or about 80%, and may be maintained at less than or about 75%, less than or about 70%, less than or about 65%, less than or about 60%, or lower. Put another way, in some embodiments the capacitor may be maintained in a position where plasma coupling may be below the resonance peak at the processing conditions, and maintained in the capacitive regime instead of the inductive regime. In some embodiments, the capacitor may be maintained in a position that is less than or about 25% from a resonance peak of the curve at plasma conditions, and may be maintained at a position that is less than or about 20% from the resonance peak, less than or about 15% from the resonance peak, less than or about 10% from the resonance peak, less than or about 5% from the resonance peak, or less, while maintaining the process in the capacitive regime.

This may increase an amount of current transfer to the substrate, which may improve film characteristics as explained above. For example, the position may maintain current received at the bottom tuner greater than or about 15 amps, and may maintain current received at the bottom tuner greater than or about 20 amps, greater than or about 22 amps, greater than or about 24 amps, greater than or about 26 amps, greater than or about 28 amps, greater than or about 30 amps, greater than or about 32 amps, or higher. This may increase carbon concentration within the film by increasing ion energy, while maintaining a density of the as-deposited film. By utilizing processes according to embodiments of the present technology, improved masks or other films may be developed, which may allow for tuning of constituent film properties to modify selectivity or other parameters of the films produced.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the tuner" includes reference to one or more tuners and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
    forming a plasma of a deposition precursor in a processing region of a semiconductor processing chamber;
    adjusting a variable capacitor within 20% of a resonance peak and to receive greater than or about 15 amps of current, wherein the variable capacitor is coupled with an electrode incorporated within a substrate support on which a substrate is seated; and
    depositing a material on the substrate.

2. The semiconductor processing method of claim 1, wherein the deposition precursor comprises a carbon-containing precursor.

3. The semiconductor processing method of claim 2, wherein the material deposited is characterized by greater than or about 67 at. % carbon within the material.

4. The semiconductor processing method of claim 3, wherein the material deposited is characterized by a density of greater than or about $1.15 \times 10^{23}$ at./cm$^3$.

5. The semiconductor processing method of claim 1, wherein the variable capacitor is maintained below the resonance peak at processing conditions for the depositing.

6. The semiconductor processing method of claim 1, wherein the variable capacitor is adjusted to receive greater than or about 25 amps of current during the depositing.

7. The semiconductor processing method of claim 6, wherein the variable capacitor is adjusted to greater than or about 35% capacitance.

8. The semiconductor processing method of claim 1, wherein the electrode incorporated within the substrate support is also coupled with a DC power supply to operate as an electrostatic chuck.

9. The semiconductor processing method of claim 1, further comprising:
etching the material relative to an exposed silicon oxide.

10. The semiconductor processing method of claim 9, wherein the silicon oxide is etched at a selectivity greater than or about 2:1 relative to the material.

11. The semiconductor processing method of claim 1, wherein the semiconductor processing chamber includes a plasma generator coupled with a faceplate at least partially defining the processing region of the semiconductor processing chamber.

12. A semiconductor processing method comprising:
forming a plasma of a carbon-containing precursor in a processing region of a semiconductor processing chamber;
increasing capacitance of a variable capacitor within 10% of a resonance peak and receiving greater than or about 15 amps of current at the variable capacitor, wherein the variable capacitor is coupled with an electrode incorporated within a substrate support on which a substrate is seated; and
depositing a carbon-containing material on the substrate.

13. The semiconductor processing method of claim 12, further comprising:
etching the carbon-containing material relative to an exposed silicon oxide.

14. The semiconductor processing method of claim 13, wherein the silicon oxide is etched at a selectivity greater than or about 10:1 relative to the carbon-containing material.

15. The semiconductor processing method of claim 12, wherein the material deposited is characterized by greater than or about 70 at. % carbon within the carbon-containing material.

16. The semiconductor processing method of claim 15, wherein the carbon-containing material deposited is characterized by a density of greater than or about $1.18 \times 10^{23}$ at./cm$^3$.

17. The semiconductor processing method of claim 12, wherein the semiconductor processing chamber includes a plasma generator coupled with a faceplate at least partially defining the processing region of the semiconductor processing chamber.

18. The semiconductor processing method of claim 12, wherein the capacitance is increased to greater than or about 40%.

19. A semiconductor processing method comprising:
forming a plasma of a carbon-containing precursor in a processing region of a semiconductor processing chamber;
increasing capacitance of a variable capacitor within 20% of a resonance peak and receiving greater than or about 15 amps of current at the variable capacitor, wherein the variable capacitor is coupled with an electrode incorporated within a substrate support on which a substrate is seated;
depositing a carbon-containing material on the substrate; and
etching the carbon-containing material relative to an exposed silicon oxide, wherein the silicon oxide is etched at a selectivity greater than or about 2:1 relative to the carbon-containing material.

20. The semiconductor processing method of claim 19, wherein the carbon-containing material deposited is characterized by greater than or about 70 at. % carbon within the carbon-containing material, and further characterized by a density of greater than or about $1.15 \times 10^{23}$ at./cm$^3$.

* * * * *